United States Patent [19]

Tasch, Jr. et al.

[11] 3,944,849
[45] Mar. 16, 1976

[54] CHARGE TRANSFER DEVICE SIGNAL PROCESSING

[75] Inventors: Al Felix Tasch, Jr.; John Millard Caywood, both of Richardson, Tex.

[73] Assignee: Texas Instruments Inc., Dallas, Tex.

[22] Filed: June 26, 1974

[21] Appl. No.: 483,328

[52] U.S. Cl. .......... 307/221 D; 250/211 J; 307/304; 357/24
[51] Int. Cl.² H01L 27/10; G08C 15/08; H01L 31/00
[58] Field of Search .......... 357/24; 307/221 D, 304; 250/211 J, 258; 178/7.1

[56] References Cited
UNITED STATES PATENTS
3,808,435  4/1974  Bate et al............................. 357/24

OTHER PUBLICATIONS
Solid–State Device Research Conf. Abstracts, *IEEE Trans. on Electron Devices*, Dec. 1973, p. 1172, abstract 3.

Carnes et al., "Measurements of Noise . . . ", *RCA Review*, Vol. 34, Dec. 1973, p. 561.

*Primary Examiner*—William D. Larkins
*Attorney, Agent, or Firm*—Harold Levine; James T. Comfort; Richard L. Donaldson

[57] ABSTRACT

An input scheme suitable for low-level input signals, e.g., from an IR detector array, wherein the input signals are transferred over respective channels to parallel inputs of a charge transfer device shift register, under control of IGFET switching transistor circuits in each channel. Corresponding IGFETS in the channels are operated by common gate voltages. Introduction of noise due to variation of the gate threshold voltages between IGFETS in the transfer circuits is obviated by using the same IGFET in each channel to reset the potential at the input node of that channel as well as to transfer the input signals over that channel to the shift register.

20 Claims, 9 Drawing Figures

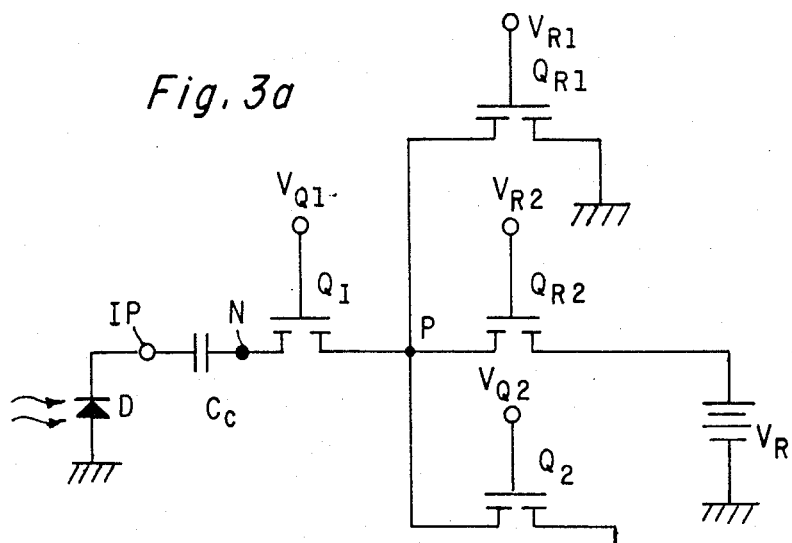
Fig. 3a
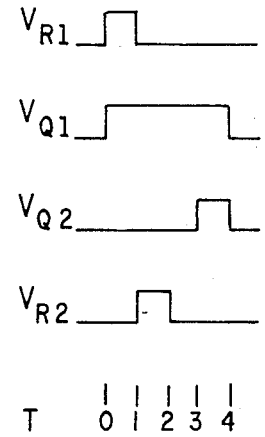
Fig. 3b
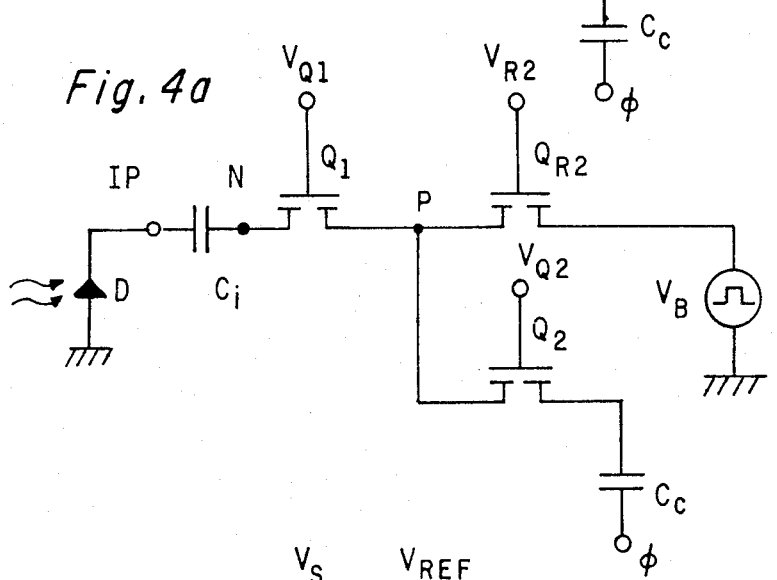
Fig. 4a
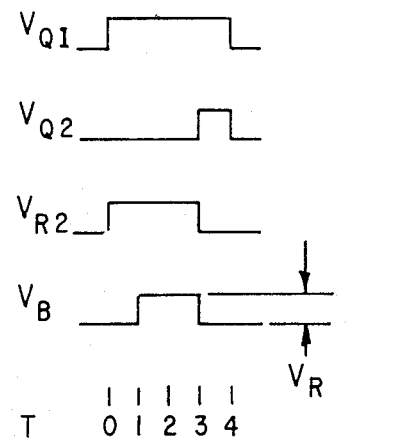
Fig. 4b
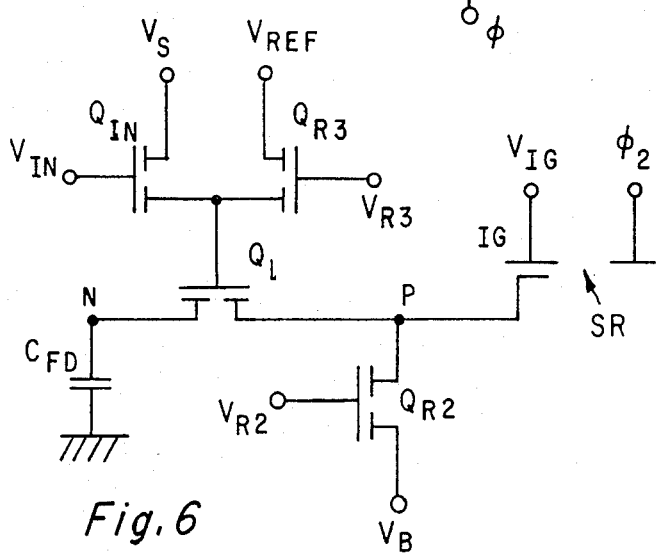
Fig. 6
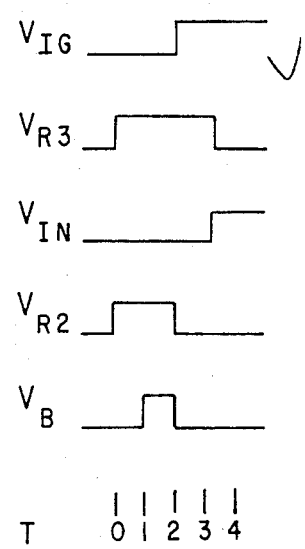

CHARGE TRANSFER DEVICE SIGNAL PROCESSING

This invention relates to multiplexing low-level signals using a charge transfer device shift register and more particularly to multiplexing signals generated by an IR detector array.

U.S. Pat. No. 3,808,435 of R. T. Bate et al. issued Apr. 30, 1974 and assigned to the assignees of the present invention discloses inter alia, an IR scanning system wherein an IR detector array generates signal related voltages which are fed to input nodes of a charge transfer device (CTD) shift register multiplexer. The input nodes are connected to respective parallel inputs of the shift register by selectively actuated insulated gate field effect transistor (IGFET) switches and then clocked along the shift register to provide a multiplexed serial output therefrom. The input nodes are connected to the parallel inputs of the shift register by respective first IGFETS, all controlled by a common gate voltage. The input nodes of the channels are reset to a predetermined reference potential in a period between inputting of successive sets of input signals into the shift register. The node resetting is accomplished using second IGFETS in the respective channels in conjunction with a common reference potential supply and a common gating voltage for the second transistors. Although excellent functional results have been obtained utilizing such a system, there are potential difficulties when there is non-uniformity between the threshold voltages of the IGFETS in the various channels which can give rise to the introduction of unwanted spatial variation in the signals inputted into the shift register (e.g., fixed pattern noise).

Accordingly, it is a principal object of the present invention to provide an improved transfer circuit for inputting signals into a CTD shift register.

It is a further object of the invention to provide a CTD multiplexer system suitable for reliable processing of low-level input signals.

In accordance with the invention, such objects are accomplished by a transfer circuit design wherein the signal input node is reset to a reference potential over the same IGFET switch that is used to transfer signal charge from the input node in to the shift register. When utilized in a system wherein low-level signals are inputted over parallel channels into a shift register, the input signal in each channel is referenced to the zero signal level of that particular channel, independently of the zero signal level of other channels. Advantages of the invention include the fact that input signal level is not adversely affected by, and fixed pattern noise is not introduced as a result of, variations in threshold voltage of the IGFET switch. Additionally, temperature variations of the IGFET switch do not result in introduction of fixed pattern noise.

For further details of the present invention, together with identification of further advantages thereof, reference will be made to the following description of preferred embodiments of the invention in relation to the accompanying drawings, wherein:

FIGS. 2a, 3a and 4a show improved coupling circuits suitable for incorporation in the system shown in FIG. 1.

FIGS. 2b, 3b and 4b show voltage waveforms associated with operation of FIGS. 2a, 3a and 4a respectively.

FIG. 6 is a circuit diagram explanatory of FIG. 5.

Figure 1:
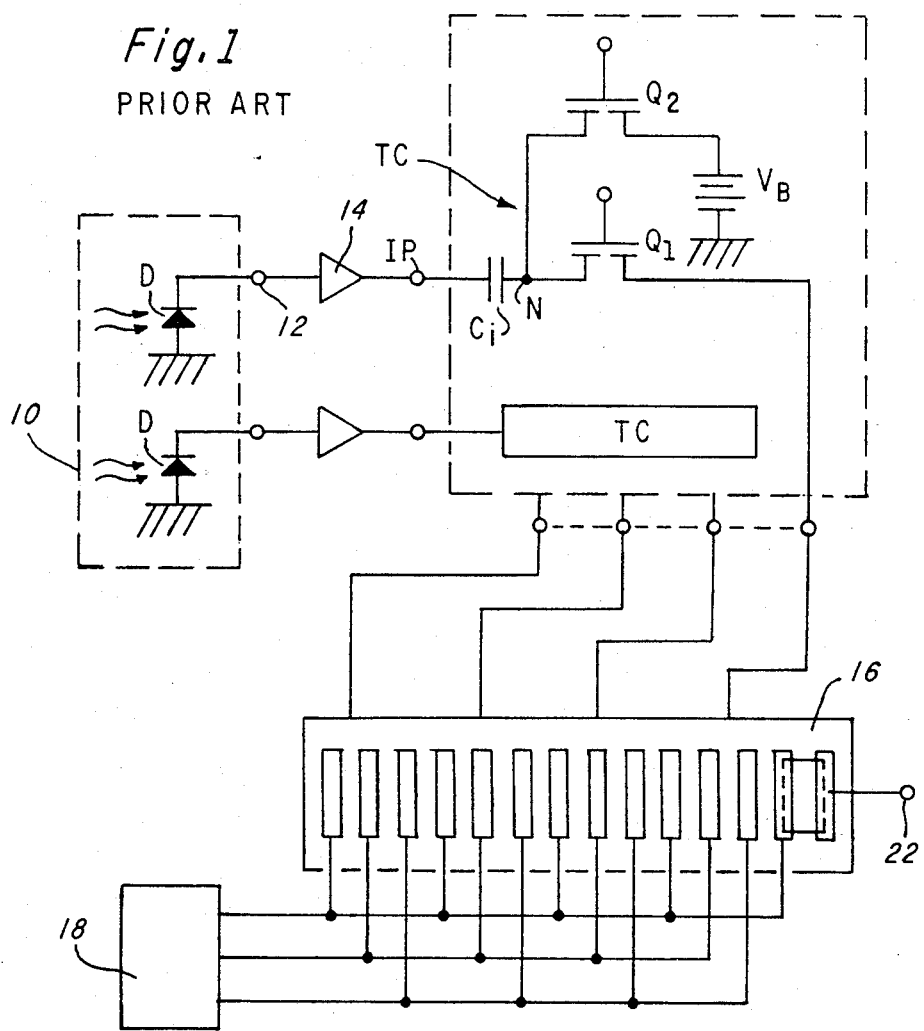
FIG. 1 shows in mainly block schematic form an IR detector system.

FIG. 1 illustrates an IR detector system in block diagrammatic format. A conventional IR detector array 10, illustrated as including diode detectors D provides electrical signals corresponding to IR irradiation of a scanned target at each output channel 12 which are amplified by respective conventional amplifiers 14. The outputs of the amplifiers 14 are applied over individual transfer circuits TC (only one of which is shown in detail) as parallel inputs to a charge transfer device (CTD) shift register 16. Suitable charge transfer device shift registers, both charge coupled devices (CCD) and bucket brigade (BB) shift registers, are discussed in detail in the literature and will not be described in more detail here. The parallel input data to the shift register 16 are propagated serially along the register under control of a variable clock pulse source 18 and the multiplexed data read out on an output terminal 22.

The transfer circuit TC shown in FIG. 1 includes an input capacitor $C_i$; an insulated gate field effect transistor (IGFET) Q1 the channel of which is connected between a node N and the associated parallel input of the shift register 16; and an IGFET Q2 the channel of which is connected between the node N and a DC bias source $V_B$. The transistors Q1 and Q2 are switched to an on condition by selective application of gate voltages $V_{Q1}$ and $V_{Q2}$ respectively.

In operation of the system shown in FIG. 1, when a scene is before the detector array 10 and the array is connected with the transfer circuits, the voltage $V_{Q1}$ is applied and the voltage at node N is constrained to be $V_T$ (i.e., the gate threshold voltage of transistor Q1) below $V_{Q1}$. If the voltage levels are so chosen that, when $\Delta T$ equals zero, the capacitances of the respective storage sites of the CTD shift register 16 are filled to one-half maximum capacity, then the signal charge transferred from the detector to the shift register will be proportional to $\Delta T$. The gate voltage $V_{Q1}$ is applied in common to the transistors Q1 of all the transfer circuits associated with each of the output amplifiers 14 and thus signal related charges on all channels are simultaneously inputted in parallel into the shift register 16. Following completion of such transfer, $V_{Q1}$ is turned off and the charges inputted into the shift register are clocked out to output terminal 22 under control of the pulse source 18. During this clocking out period, a chopper (not illustrated) removes the scene from the detector array 10 and the gate voltage $V_{Q2}$ is applied to transistors Q2 of all the transfer circuits TC to return the nodes N thereof to a known voltage $V_B - V_T$. The system now is in a preset condition and ready to receive another set of input signals from the detector array 10.

The system as thus far described with reference to FIG. 1 is disclosed in greater detail in U.S. Pat. No. 3,808,435, R. T. Bate et al. issued Apr. 30, 1974 and assigned to the Assignee of the present invention, the disclosure of said patent being incorporated herein by reference.

In operation of the system as disclosed with reference to FIG. 1, it is preferred that, by use of transistor Q2 and the bias potential $V_B$, the nodes N be preset such that for $\Delta T$ equal to zero (i.e., no temperature difference from background - approximately 300°K) no charge flows into the shift register 16 other than an intentionally introduced D. C. offset or fat zero signal $V_F$. That is, during presence of the voltage $V_{Q2}$, the potential source $V_B$ pulls the node N to a voltage, the value of which is $V_{Q2} - V_T + V_F$. As mentioned previously, the voltages $V_{Q1}$, $V_{Q2}$, and $V_B$ are common to all of the input channels to the shift register 16.

In certain applications of IR detector systems, such as that described in the above-referenced U.S. Pat. No. 3,808,435, the signal levels inputted to the shift register 16 may be as low as about 10 microvolts; consequently, the noise level must be very low, preferably photon background noise limited. Referring again to FIG. 1, and considering two input channels $i$ and $j$, suppose that the threshold voltages of the transistors Q1 of those channels are $V_{Ti}$ and $V_{Tj}$ respectively, and that the threshold voltages differ by an amount $\Delta V_T$. Also, assume that the node N at channel $i$ is set to give zero signal for $\Delta T$ equal to zero. Then the node voltages of channels $i$ and $j$ are:

$$V_{Ni} = V_{Q1} - V_{Ti} + V_F$$

$$V_{Nj} = V_{Q1} - V_{Tj} + V_F$$

$$= V_{Q1} - V_{Ti} + V_F + \Delta V_T$$

Thus, a false noise signal equal to $\Delta V_T$ appears at the input channel $j$ of the shift register 16. Desirably, at zero temperature difference from background, i.e., $\Delta T$ equal to zero, a uniform signal input level should be present at all input channels of the shift register 16 but in order to obtain a satisfactory signal-to-noise ratio when processing signals as low as 10 microvolts, $V_T$ then would need to be of the order of 1 microvolt or less which, from a practical viewpoint, is an unduly stringent restriction.

The following embodiments of the present invention provide improved transfer circuits suitable for use in place of the transfer circuits TC described with reference to FIG. 1, and wherein the above-identified problem of introduction of unwanted noise signals due to nonuniformity in threshold voltages between the transistors Q1 of the various channels is overcome. In each of the embodiments of the invention to be described, resetting of the channel node N and transfer of the input signal from the charge detector array into the shift register 16 is effected under control of a single IGFET, Q1 in each channel. The node of each input channel is set to its respective level of $V_{Q1} - V_{Tj}$ (for the $j$ channel) for zero signal level, i.e., $\Delta T = 0$ (ignoring introduction of any fat zero signal). Thus, the signal at each input channel is referenced to the zero signal level of that specific channel rather than to the zero signal level of any other channel and consequently variation in threshold voltage between the transistors Q1 of the various channels does not result in introduction of noise into the signal inputted into the shift register 16.

Figure 2A:
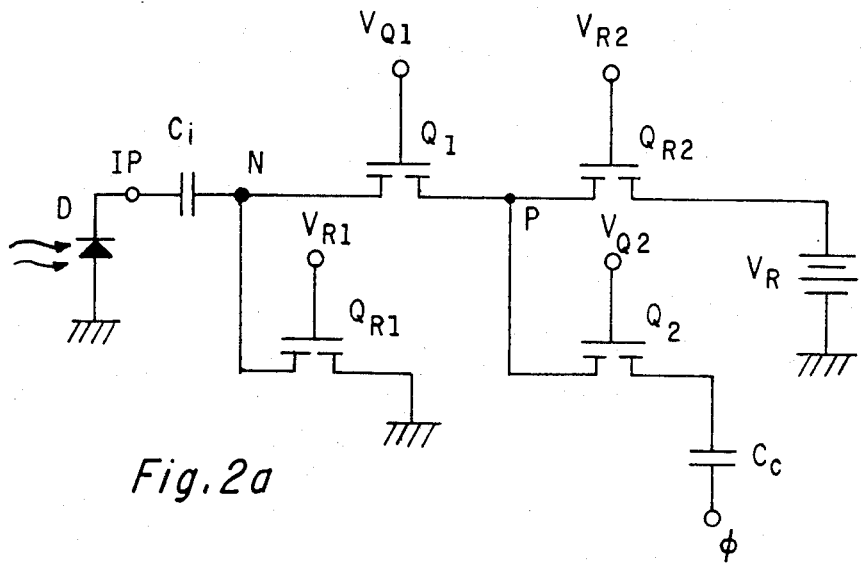

A first embodiment of the invention is illustrated by FIG. 2a which shows the transfer circuit TC for one channel of the system shown in FIG. 1, the transfer circuits for the remaining channels being identical to that shown in FIG. 2a. The transfer circuit includes an IGFET Q1 connected between the node N and node P, the latter node being connected by an IGFET Q2 to the input of the associated storage site of the shift register 16 represented diagrammatically by the storage site storage capacitance $C_c$. An IGFET QR1 is connected between the node N and ground while an IGFET QR2 is connected between node P and a d. c. bias potential $V_R$.

Figure 2B:
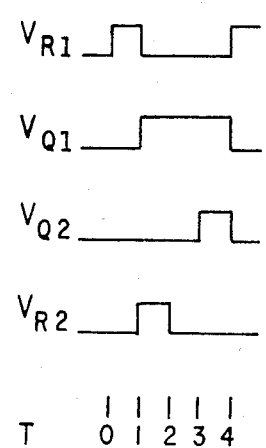

The transistors Q1, Q2, QR1 and QR2 of each of the channels have associated common gate voltages $V_{Q1}$, $V_{Q2}$, $V_{R1}$ and $V_{R2}$ selectively applied thereto, the timing relationships between these voltages being illustrated by FIG. 2b. Assuming use of the transfer circuit shown in FIG. 2a, in the respective channels of an IR detector system as shown by FIG. 1, the manner of operation is as follows:

1. $T_0 - T_1$, FIG. 2b. When the scene is removed from the detector array 10, the voltages $V_{Q1}$, $V_{Q2}$ and $V_{R2}$ are turned off; voltage $V_{R1}$ is turned on and node N is preset to ground potential.

2. T1 – T2, FIG. 2b. Transistor QR1 is then turned off and transistors Q1 and QR2 are turned on, transistor QR2 being turned on harder than transistor Q1. Node N is then reset to a potential $$V_N = V_{Q1} - V_T$$

3. T2 – T3, FIG. 2b. Transistor QR2 is then turned off.

4. T3 – T4, FIG. 2b. The scene to be scanned is then brought before the detector array 10 and transistor Q2 is turned on. The electrical charge present at node n due to the signal from the scene is then transferred over transistor Q1 and transistor Q2 to the associated storage site capacitance $C_c$ of the shift register 16. It will be appreciated that simultaneously, scene related signal charges are also transferred from the detector array over each of the associated channels into the shift register 16. The scene is removed from the detector and the clock pulse source 18 operated to clock the charges inputted into the shift register 16 to provide a serial multiplexed output at the terminal 22.

The above-described sequence of steps is then continued on a repetitive basis.

In order to introduce an electrical fat zero into the shift register, the voltage $V_{Q1}$ can be changed by an amount $\Delta V_{Q1}$ when the scene is incident on the detector array 10 (T3 – T4).

An alternative embodiment of the invention is shown in FIG. 3a. FIG. 3a differs from FIG. 2a in that the transistor QR1 is now connected between the node P and ground.

The same sequence of operation as described with reference to FIG. 2a and 2b applies to the circuit shown in FIG. 3a, except that during the period T0 – T1, with the scene removed from the detector, transistors Q2 and QR2 are turned off as described with reference to FIGS. 2a and 2b, but transistor QR1 which is initially off, is turned on so that nodes N and P are both preset to or near ground potential.

A further embodiment of the invention is shown in FIG. 4a, associated voltage waveforms being illustrated by FIG. 4b. FIG. 4a shows a simpler structure than FIGS. 2a and 3a, requiring one less IGFET. In FIG. 4a, *IGFET Q1* is connected between nodes N and P, node P being connected to the associated shift register storage site by *IGFET Q2*. *IGFET QR 2* connects the node P to a time varying bias potential $V_B$. The operational sequence of the circuit shown in FIG. 4a is as follows:

the detector array 10, transistor Q2 is turned off, transistor QR2 is turned on and the potential $V_B$ is at zero volts. (It may not be essential for $V_B$ to drop to zero volts, but at least to some voltage below the level reached by the node N during the scene integration.) Transistor Q1 is in an on condition and the node N is preset to ground potential.

2. T1 - T2, FIG. 4b. The potential $V_B$ rises to a value $V_R$ while transistors Q1 and QR2 remain in an on condition but with transistor QR2 turned on harder than transistor Q1, while transistor Q2 remains in an off condition. The node N then is reset to a value $V_{Q1} - V_T$.

3. T2 - T3, FIG. 4b. Transistor QR2 is turned off, transistor Q2 is turned on to conduct harder than transistor Q1 and the scene is brought before the detector array 10. Again, at this time the voltage $V_{Q1}$ may be increased by a suitable value if it is desired to introduce an electrical fat zero into the signal input to the shift register 16. The signal related charge from the detector array 10 is then transferred into the shift register 16 as previously described and clocked along the shift register (with the scene removed from the detector array) to provide a multiplexed output at the terminal 22.

The sequence of steps 1, 2 and 3 is then carried out repetitively.

In operation of the transfer circuits shown in FIGS. 2, 3 and 4 the following considerations determine the gate voltages applied to the IGFETS. If the input signal(s) can be negative or positive, relative to a reference value (i.e., greater or less than the value corresponding to $\Delta T = 0$ in the IR detector system described), then the gate voltage $V_{Q1}$ should be chosen such that for zero input signal level, the CCD storage site concerned is filled to one-half maximum capacity. This provides optimum dynamic range. This condition is described approximately by the relation:

$$(V_{Q1}(T3-T4) - V_{Q1}(T0-T3)) C_t \simeq \tfrac{1}{2} V_c C_c$$

where:
$V_c$ = CCD clock voltage
$C_c$ = CTD storage site capacitance.

If the input signal excursion is in one direction only, then $V_{Q1}$ is chosen such that for zero input signal the CCD storage site is either filled to near maximum capacity or to only a few percent of maximum capacity. The choice depends on the polarity of the input signal and the channel conductivity type of the IGFETS (i.e., N-channel or P-channel). For example for N-channel IGFETS and positive input signal voltages, the CCD storage site would be filled to near maximum capacity for zero input signal level. A positive input signal would then result in a reduction in charge stored at that storage site, proportional to the input signal level.

The requirements for other IGFET gate voltages are then as follows:
$V_{R2} > V_{Q1}$
$V_R > V_{R2} - V_T$ for FIGS. 2 and 3.
For FIG. 4,
$V_B = V_R > V_{R2} - V_T$ from T1 to T3
$V_c > V_{Q2} > V_{Q1}$
$V_{R1} > V_T$ The first three requirements ensure that transistors Q1, QR2 and Q2 operate in the saturation mode.

In the description of FIGS. 1–4, it has been assumed that the IGFETs are n-channel devices and that the bias source $V_B$ produces positive pulses; for operation of the circuits using p-channel devices, the bias source $V_B$ would produce negative pulses.

Although in each of FIGS. 2a, 3a and 4a, the transistors Q2 have been described as conventional IGFETs, they are preferably provided by the input gating devices of the CTD shift register.

Each of the transistor circuits described above with reference to FIGS. 2, 3 and 4 may be implemented using discrete components, but preferably integrated circuit techniques are utilized to incorporate the circuit elements of the transfer circuits on the same semiconductor chip as the shift register 16, the transfer circuit elements being located adjacent the input of the shift register so that undesirable stray capacitance and noise may be minimized.

Figure 5:
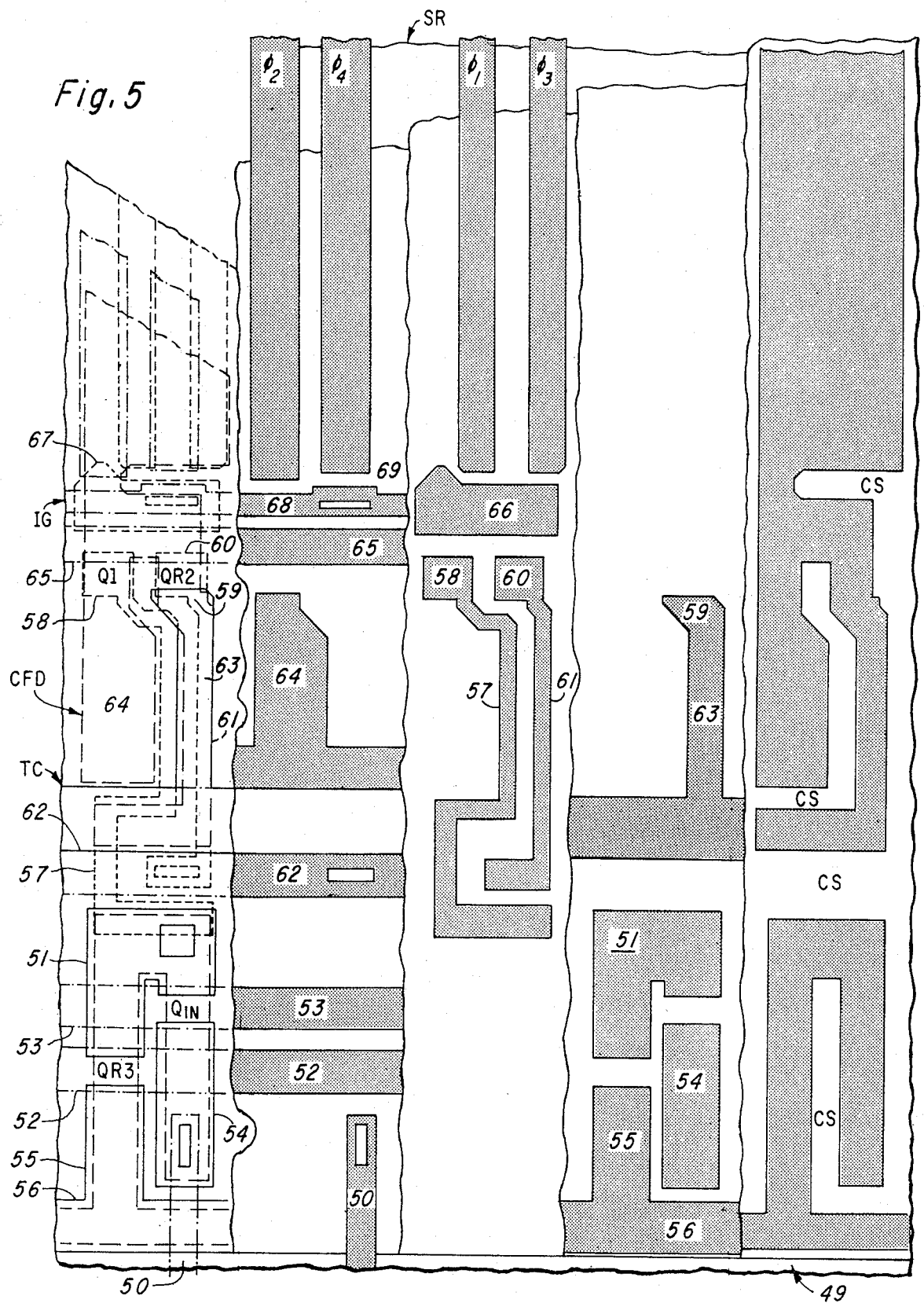
FIG. 5 shows an integrated circuit embodiment of the invention with associated voltage waveforms shown in FIG. 6.

A preferred integrated circuit embodiment of the invention is illustrated by FIG. 5, the circuit diagram being shown in FIG. 6.

In fabrication of the integrated circuit shown in FIG. 5, a p-type silicon substrate 49 is used with a two-level interconnection system. A lower level of interconnections is defined by polycrystalline silicon (polysilicon) conductors insulated from the substrate by a silicon oxide layer while the upper level of interconnections is defined by a metal, preferably aluminum, conductors insulated from the polysilicon conductors by a silicon oxide insulating layer. Conventional processing procedures may be used to fabricate the integrated circuit and will not be described. In addition, semiconductor materials other than silicon may be used for the substrate, insulator materials other than silicon oxide may be used and different interconnection materials and schemes may be used, all as well appreciated in the art.

The integrated circuit includes a 4-phase CCD shift register SR wherein a lower-level set of spaced polysilicon conductors define $\phi_1$ and $\phi_3$ control electrodes, and an upper level set of metal conductors are interposed between the $\phi_1$ and $\phi_3$ control electrodes in insulated and marginally overlapping relationship therewith, to define the $\phi_2$ and $\phi_4$ control electrodes. The control electrodes are connected to respective clock lines for supplying $\phi_1$, $\phi_2$, $\phi_3$ and $\phi_4$ phase clock pulses to the control electrodes to shift charge serially along the shift register in conventional manner.

Each storage site or bit of the shift register SR has associated therewith a transfer circuit TC formed as part of the integrated circuit.

Each transfer circuit includes n-channel depletion mode IGFETS $Q_{IN}$ and QR3 sharing a common source (or drain) region 51 and respectively having metal gate electrodes 52 and 53. The gate lines 52 of all the transfer circuits are connected in common, and the gate electrodes 53 of all the transfer circuits are connected in common. The drain (source) region 54 of transistor $Q_{IN}$ is connected to a signal input line provided by a metal conductor 50. The drain(source) region 55 of transistor QR3 is a projection from a doped region 56 common to all of the transfer circuits TC and which is connected to a reference voltage signal line $V_{REF}$.

The common source (drain) region 51 is connected by a polysilicon conductor 57 to the polysilicon gate 58 of an IGFET Q1. Located adjacent the transistor Q1 is an IGFET QR2 having a doped drain(source) region 59, and a polysilicon gate 60 which is connected by a polysilicon conductor 61 to a metal conductor 62 common to all the transfer circuits TC. The drain region 59 is an extension of a doped region 63 common to all the transfer circuits TC and connected to a bias voltage supply terminal $V_B$. A capacitor $C_{FD}$ is defined by a metal electrode 64 insulated from the underlying silicon substrate, defining a virtual capacitor which stores charge in an inverted region of the silicon substrate surface beneath the electrode 64. The transistor Q1 has virtual source and drain regions consisting of the capacitor under electrode 64 and the inversion region under electrode 65. The inversion region under metal conductor 65 also defines a virtual source (drain) region for transistor QR2 and the input gate IG.

A polysilicon conductor 66 is marginally overlaid by the metal conductor 65 and has a projection 67 extending beneath one end of the $\phi_2$ electrode of the associated storage site of the shift register SR. A metal electrode 68 common to all of the transfer circuits overlies the conductor 66 and is electrically connected thereto by contact 69, thereby providing an input gating device IG functionally equivalent to the IGFET Q2 of FIG. 4.

The shift register SR also includes a conventional output transfer gate (not shown) which is operable to transfer data serially from the shift register to an IGFET output amplifier (not shown).

The doped regions 51, 54, 55 and 59 conveniently may be n+ diffused or implanted regions. The integrated circuit structures also incorporates channel stop regions CS for confining charge flow to desired regions of the substrate. These charge stop regions are defined by locally thickened silicon oxide areas overlying p-doped regions in the substrate 49.

The circuit described with reference to FIGS. 5 and 6 may be operated as follows:

1. A voltage is applied to the conductor 68 to turn off the input gating devices IG and disconnect the shift register from the nodes P of the transfer circuits TC.
2. Voltages are applied to the gates of transistors QR3 and $Q_{IN}$ to turn on transistor QR3 and turn off transistor $Q_{IN}$.
3. The gate voltage of transistor QR2 is raised to a high level, and the source $V_B$ is pulsed low to put electrons onto the capacitor $C_{FD}$ and is then pulsed high again to pull the voltage across $C_{FD}$ to a value $V_{REF} - V_{T1}$, where $V_{T1}$ is the gate threshold voltage of transistor Q1.
4. The gate voltage of transistor QR2 is lowered to turn that transistor off, the input gate IG is turned on concurrently with depression of the potential beneath the $\phi_2$ electrode of shift register by application of the $\phi_2$ clock pulse thereto.
5. The gate voltage of transistor QR3 is lowered to turn off that transistor while the gate voltage of transistor $Q_{IN}$ is raised to turn on that transistor. The capacitor $C_{FD}$ then loses electrons until the capacitor voltage reaches $V_{in} - V_{T1}$, with a corresponding amount of charge being entered into the storage site of the shift register SR beneath the $\phi_2$ electrode.
6. The input gate device IG is turned off, completing one cycle of operation and the charge entered into the shift register is serially propagated along the shift register to the output thereof by application of clock pulses $\phi_1$, $\phi_2$, $\phi_3$ and $\phi_4$ to the control electrodes in known manner.

It is to be noted that the amount of charge injected into a $\phi_2$ storage site of the shift register is $$C_{FD}[(V_{REF} - V_{T1}) - (V_{in} - V_{T1})] = C_{FD}(V_{REF} - V_{in})$$

For an n-channel CCD shift register, the charge injected consists of electrons and $V_{in}$ must be greater than $V_{REF}$. For a. c. coupled input signals, the d. c. bias point preferably is such that $$Q_{DC} = C_{FD}(V_{REF} - V_{in(DC)})$$

corresponds to the storage site being filled to 50 percent maximum capacity, following the principles explained herein.

In all of the above-described embodiments, since the charge transferred by the transfer circuit into the shift register is derived from the difference between two voltage levels at a capacitive node, both levels being set over the common IGFET Q1, then variations in threshold voltage of that transistor (as well as variation between the threshold voltages of several transistor Q1 in their respective channels) do not effect the signal levels inputted into the shift register. Additionally, variations of input signal level are not affected by changes in threshold voltage of transistor Q1.

It is to be appreciated that although the above embodiments have been described in relation to use of a plurality of transfer circuits for inputting signals in parallel into a CCD shift register, serial input techniques also could be used. For example, the inputs from several transfer circuits TC could be entered into the serial input of the shift register using known multiplexing techniques. In addition, use of a single transfer circuit TC offers attractive advantages for inputting analog signals from a single source serially into a CCD shift register. In relation to FIGS. 2, 3, 4 and 6, input signals from a single transfer circuit TC could be applied from any suitable analog signal source (with particular advantages to be realized when the input signals are low-level) to the input IP and the transistor Q2 in FIGS. 2, 3 and 4 and the input gate IG in FIG. 6 would function as the serial input gate for the CCD shift register.

An important advantage of this input circuit in this case is replaceability. That is, if the integrated circuit part containing the input circuit and CTD shift register failed, an "off the shelf" replacement part could be installed without requiring adjustment for threshold voltage. This is so because the input circuit is independent of threshold voltage.

Reference is made to application Ser. No. 373,567 filed June 25, 1973 by Dennis D. Buss et al. for CCD Input Node Preset Method and assigned to the assignee of the present application. That application includes teaching of a method of inputting charge packets into a CCD structure wherein charge transfer occurs in a first direction between first and second charge storage regions during application of an input signal to a gate electrode disposed between and insulated from the two charge storage regions, until the surface potentials of the charge storage regions are equal to each other. Then the potential of the first charge storage region is changed such that charge transfer occurs along a channel between the two charge storage regions in an opposite direction, until the channel becomes pinched off at a surface potential of the second charge storage region dependent upon the amplitude of the input signal applied to the gate electrode.

Although the above embodiments of the invention have been described in relation to transfer of signals from a detector array into a charge transfer device multiplexing shift register, it will be appreciated that the input signals could be derived from any other source and that the invention is generally applicable to CTD shift register multiplexing of low-level signals with minimal introduction of noise.

What is claimed is:

1. Charge transfer device signal processing apparatus including a charge transfer device shift register having at least one input for receiving analog input signals; first semiconductor switch means for connecting said input to a first reference potential during a first clock period; second semiconductor switch means including a first transistor switch means for resetting said input to a second predetermined reference potential during a second clock pulse period; and third semiconductor switch means operable to connect said input to said charge transfer device shift register during a third clock pulse period for applying an analog input related signal thereto for serial propagation along said shift register said second and third semiconductor switch means each including a common switching transistor means for controlling the resetting of said input to said second predetermined reference potential and for controlling transfer of said input signal from said input into said shift register.

2. Apparatus according to claim 1, wherein said analog input related signals are serially inputted to said shift register.

3. Apparatus according to claim 1, wherein said shift register is a charged coupled device shift register.

4. Apparatus according to claim 1, wherein said third semiconductor switch means includes input gating means for said shift register, connected with said first semiconductor switch means.

5. A signal processing apparatus according to claim 1, wherein the first transistor switch means of said second semiconductor switch means comprises a first insulated gate type field effect transistor, and wherein said second semiconductor switch means further includes a second insulated gate type field effect transistor switch connected in series with said first field effect transistor and a bias potential source.

6. A signal processing apparatus according to claim 1, wherein said third semiconductor switch means includes an insulated gate type field effect transistor switch connected in series between said first field effect transistor switch and a signal input for said shift register.

7. A signal processing apparatus according to claim 1, wherein said first semiconductor switch means includes an insulated gate type field effect transistor switch operable during said first clock period to connect said input directly to ground.

8. A signal processing apparatus according to claim 1, wherein said first semiconductor switch means includes a first insulated gate type field effect transistor connected in series with a further transistor switch both operable during said first clock period to connect said input to ground.

9. A signal processing apparatus according to claim 1, wherein said first semiconductor switch means and said second semiconductor switch means commonly comprise said first field effect transistor switch connected in series with a second insulated gate type field effect transistor switch to a bias potential selectively adjustable to ground potential during said first clock pulse period, said first and second field effect transistors being operable during said first clock pulse period to connect said input to said ground potential level; said bias potential being selectively adjustable to a second bias potential level during said second clock pulse period and said first and second field effect transistors being operable during said second clock pulse period to reset said input to said second reference potential.

10. A charge transfer device signal processing system including a charge transfer device shift register, a plurality of inputs for receiving analog input signals, and means for selectively transferring signals from said plurality of inputs in parallel into said shift register at a first clock rate for serial propagation along said shift register at a second clock rate;
said transfer means including for each input:
 a. first semiconductor switch means operable to connect said input to a first reference potential during a first clock period common to all said inputs; and
 b. second semiconductor switch means operable to reset said input to a second predetermined reference potential during a second clock pulse period common to all said inputs;
and third semiconductor switch means operable to connect said input to said charge transfer device shift register for supplying a parallel input signal thereto during a third clock pulse period common to all said inputs; wherein each of said first, second and third semiconductor switch means includes at least one gate controlled majority carrier semiconductor switch device, and wherein said second and third semiconductor switch means include a common gate controlled semiconductor switch device for controlling the resetting of said input to said second referenced potential and for controlling transfer of said input signal from said input into said shift register.

11. A signal processing system according to claim 10, wherein said third semiconductor switch means further includes input gating means of said shift register.

12. A signal processing system according to claim 11, wherein said charge transfer device is a charge coupled device shift register having charge transfer electrodes disposed at and insulated from a surface of a semiconductor substrate, and wherein said first, second and third insulated gate field effect transistors are incorporated as circuit elements at said surface of said semiconductor substrate.

13. A charge transfer device signal processing system including a charge transfer device shift register, a plurality of inputs for receiving analog input signals, and means including shift register input gating means for selectively transferring signals from said plurality of inputs in parallel into said shift register at a first clock rate for serial propagation along said shift register at a second clock rate,
said transfer means including for each input:
 a. first and second insulated gate field effect transistors connected in series between said input and a bias potential source;
 b. said first transistor and said input gating means connected in series between said input and a parallel input for said shift register;
 c. a third insulated gate field effect transistor connected between said input and ground;
said first, second and third transistors and said input gating means including gates connected with respective gate signal lines for applying clock pulses to
 1. turn on only said third transistor during a first clock period;
 2. enable only said first and second transistors during a second clock pulse period with a larger gating signal applied to the gate of said second transistor than is applied to the gate of said first transistor; and 3. enable only said first transistor and said input gating means during a third clock pulse period . with a larger gating signal applied to said input gating means than is applied to the gate of said first transistor.

14. A charge transfer device signal processing system including a charge transfer device shift register, a plurality of inputs for receiving analog input signals, and means for selectively transferring signals from said plurality of inputs in parallel to input gating means for said shift register at a first clock rate, for serial propagation along said shift register at a second clock rate, said transfer means including for each input:
   a. first and second insulated gate field effect transistors connected in series between said input and a bias potential source;
   b. said first transistor connected between said input and said input gating means for said shift register;
   c. a third insulated gate field effect transistor connected between the junction of said first and second transistors and ground;
said first, second and third transistors and said input gating means including gates connected with respective gate signal lines for applying clock pulses to
   1. enable only said first and third transistors during a first clock period;
   2. enable only said first and second transistors during a second clock pulse period with a larger gating signal applied to the gate of said second transistor than is applied to the gate of said first transistor;
   3. enable only said first transistor and said input gating means during a third clock pulse period with a larger gating signal applied to said input gating means than is applied to the gate of said first transistor.

15. A signal processing system according to claim 14, wherein said charge transfer device is a charge coupled device shift register having charge transfer electrodes disposed at and insulated from a surface of a semiconductor substrate, and wherein said first, second and third insulated gate field effect transistors are incorporated as circuit elements at said surface of said semiconductor substrate.

16. A charge transfer device signal processing system including a charge transfer device shift register, a plurality of inputs for receiving analog input signals, and means for selectively transferring signals from said plurality of inputs in parallel to input gating means for said shift register at a first clock rate for serial propagation along said shift register at a second clock rate, said transfer means including for each input:
   a. first and second insulated gate field effect transistors connected in series between said input and a selectively adjustable bias potential source;
   b. said first insulated gate field effect transistor connected between said input and said input gating means for said shift register;
said first and second transistors and said input gating means including gates connected with respective gate signal lines for applying pulses to
   1. enable only said first and second transistors during a first pulse period during which said bias potential source is adjusted to ground potential;
   2. enable only said first and second transistors during a second pulse period during which said bias potential is adjusted to a predetermined bias level;
   3. enable only said first transistor and said input gating means during a third pulse period during which said bias potential source is adjusted to said predetermined bias level.

17. A signal processing system according to claim 16, wherein said charge transfer device is a charge coupled device shift register having charge transfer electrodes disposed at and insulated from a surface of a semiconductor substrate, and wherein said first and second insulated gate field effect transistors are incorporated as circuit elements at said surface of said semiconductor substrate.

18. A signal processing system according to claim 16, wherein said plurality of inputs are connected to a corresponding plurality of parallel output channels of infra-red detector means for producing electrical signals corresponding to detected incident radiation.

19. A system according to claim 18, wherein each detector comprises an infra-red wavelength photo-sensitive diode.

20. In a charge transfer device signal processing system including a charge transfer device shift register, at least one input for receiving for an analog input signal, and means including charge transfer input gating means for selectively transferring signals from said input for propagation along said shift register; said transfer means including:
   a. a first gate controlled transistor connected between capacitor store means and said input gating means for said shift register;
   b. a second gate controlled transistor connected between said input and the gate of said first transistor;
   c. a third gate controlled transistor connected between a bias potential source and the gate of said first transistor; and
   d. a fourth gate controlled transistor connected between a selectively adjustable bias source and said input gating means for said shift register;
said third and fourth transistors and said input gating means having gates connected with respective gate signal lines for applying clock pulses:
   1. to enable only said third and fourth transistors during a first clock period initially with said adjustable bias supply at a first predetermined value to permit discharge of said capacitor store means through said first transistor, and then with said adjustable bias supply at a second predetermined value to charge said capacitor store means through said first transistor to a reference potential determined by the gate voltage of said first transistor;
   2. to enable only said input gating means and said third transistor during a second clock pulse period;
   3. to enable only said input gating means during application of a signal input to the gate of said second transistor to apply said signal input as a gate voltage to said first transistor to cause discharge of said capacitor store means through said first transistor and said input gating means to enter into said shift register an amount of charge determined by the input signal dependent gate voltage of said first transistor.

* * * * *